US009870810B2

(12) United States Patent
Kurjanowicz et al.

(10) Patent No.: US 9,870,810 B2
(45) Date of Patent: Jan. 16, 2018

(54) METHOD AND SYSTEM FOR POWER SIGNATURE SUPPRESSION IN MEMORY DEVICES

(71) Applicant: Sidense Corp., Ottawa (CA)

(72) Inventors: Wlodek Kurjanowicz, Arnprior (CA); Betina Hold, Ottawa (CA)

(73) Assignee: Sidense Corp., Ottawa (CA)

( * ) Notice: Subject to any disclaimer, the term of this patent is extended or adjusted under 35 U.S.C. 154(b) by 0 days.

(21) Appl. No.: 15/247,050

(22) Filed: Aug. 25, 2016

(65) Prior Publication Data

US 2017/0337957 A1 Nov. 23, 2017

Related U.S. Application Data

(60) Provisional application No. 62/338,277, filed on May 18, 2016.

(51) Int. Cl.
*G11C 7/10* (2006.01)
*G11C 7/22* (2006.01)
*G11C 7/06* (2006.01)

(52) U.S. Cl.
CPC ............. *G11C 7/222* (2013.01); *G11C 7/065* (2013.01); *G11C 7/1048* (2013.01); *G11C 7/1057* (2013.01)

(58) Field of Classification Search
CPC ..... G11C 7/1006; G11C 8/10; G11C 16/0483; G11C 16/08; G11C 16/10; G11C 2216/22;

(Continued)

(56) References Cited

U.S. PATENT DOCUMENTS 5,481,500 A 1/1996 Reohr et al.
6,570,795 B1 5/2003 Fricke et al.
(Continued)

FOREIGN PATENT DOCUMENTS

CN 103888247 A 6/2014
TW 557636 B 10/2003
(Continued)

OTHER PUBLICATIONS

International Patent Application No. PCT/CA2010/000137, International Search Report dated Apr. 19, 2010.
(Continued)

*Primary Examiner* — Thong Q Le
(74) *Attorney, Agent, or Firm* — Fenwick & West LLP

(57) ABSTRACT

A method and system for suppressing power signature in a memory device during read operations. A memory array stores data in an even number of cells per bit, such as 2 cells per bit, where complementary data states are stored in each pair of cells. Differential read out of the memory array via the bitlines suppresses power signature because the same power consumption occurs regardless of the data being accessed from the memory array. Data output buffers that provide complementary data to a downstream circuit system are reset to the same logic state prior to every read operation such that only one output buffer (in the complementary output buffer pair) is ever driven to the opposite logic state in each read cycle. Hence the power consumption remains the same regardless of the data states being read out from the memory array and provided by the output buffers.

24 Claims, 16 Drawing Sheets

(58) Field of Classification Search
CPC ....... G11C 7/1045; G11C 7/1048; G11C 8/08;
G11C 7/10; G11C 7/1018; G11C 7/1039;
G11C 7/106; G11C 7/1075; G11C
7/1087; G11C 11/4076; G11C 11/4096
USPC .......... 365/230.06, 185.111, 230.03, 189.05,
365/203, 238.5, 185.12, 185.17, 189.011,
365/189.04, 189.08, 191, 194, 201
See application file for complete search history.

(56) References Cited

U.S. PATENT DOCUMENTS

| | | | |
|---|---|---|---|
| 7,526,087 | B2 | 4/2009 | Sun |
| 7,554,865 | B2 | 6/2009 | Pickles |
| 7,719,896 | B1 | 5/2010 | Pesavento et al. |
| 7,834,659 | B1 | 11/2010 | Im et al. |
| 8,031,540 | B2 | 10/2011 | Pickles |
| 8,213,211 | B2 | 7/2012 | Kurjanowicz |
| 8,330,493 | B2 | 12/2012 | Myers et al. |
| 8,860,465 | B2 | 10/2014 | Myers et al. |
| 2002/0110033 | A1 | 8/2002 | Forbes |
| 2005/0254294 | A1 | 11/2005 | Iwata |
| 2006/0244099 | A1 | 11/2006 | Kurjanowicz |
| 2007/0165441 | A1 | 7/2007 | Kurjanowicz et al. |
| 2008/0316789 | A1 | 12/2008 | Fredeman et al. |
| 2009/0086553 | A1* | 4/2009 | Lee ................. G11C 7/1006 365/189.08 |
| 2009/0279687 | A1 | 11/2009 | Yoshimoto et al. |
| 2014/0167837 | A1 | 6/2014 | Yannette et al. |
| 2015/0332750 | A1 | 11/2015 | Dong et al. |
| 2016/0112662 | A1* | 4/2016 | Guillon ............... H04N 5/3698 348/294 |

FOREIGN PATENT DOCUMENTS

| | | |
|---|---|---|
| TW | 200823926 A | 6/2008 |
| TW | 201502854 A | 1/2015 |
| TW | 201537332 A | 10/2015 |
| TW | 201606563 A | 2/2016 |
| WO | 2008036589 A2 | 3/2008 |
| WO | 2008077237 A1 | 7/2008 |

OTHER PUBLICATIONS

International Patent Application No. PCT/CA2010/000137, Written opinion dated Apr. 19, 2010.
U.S. Appl. No. 12/701,140 Notice of Allowance dated Apr. 13, 2012.
U.S. Appl. No. 12/701,140 Office Action dated Dec. 27, 2011.
Taiwan Patent Application No. TW105129542, Office Action and Search Report dated Aug. 23, 2017—English Translation Available.
Korean Office Action, Korean Application No. 10-2016-01266975, dated Oct. 23, 2017, 12 pages (with English summary).

* cited by examiner

METHOD AND SYSTEM FOR POWER SIGNATURE SUPPRESSION IN MEMORY DEVICES

CROSS REFERENCE TO RELATED APPLICATIONS

This application claims the benefit of priority of U.S. Provisional Patent Application No. 62/338,277, filed on May 18, 2016 which is hereby incorporated by reference.

FIELD

The present disclosure relates generally to a memory device. More particularly, the present disclosure relates to power signature suppression in a memory device.

BACKGROUND

It is well known that memory devices store data which is used by other systems to execute certain functions. Such data can be as simple as multimedia files or user readable documents, and the memory devices that store such data can be non-volatile memory such as portable USB drives, various known memory cards and solid state hard disk drives, by example. Such memory devices can be volatile memory devices such as dynamic random access memory (DRAM) or static random access memory (SRAM) by example. In these cases, the memory devices can be standalone semiconductor memory chips encapsulated in a package.

Another type of data is more sensitive, such as encryption keys or passwords that are stored in a memory device and read out by a host system when needed. Such data can be stored in a memory device integrated with other circuits, such as in an application specific integrated circuit (ASIC) or other mixed circuit system. Alternately, a standalone memory device can be interconnected with a host system on a printed circuit board or in a multi-chip package to provide the storage capability.

Naturally, such sensitive data should be secure from intentional and unintentional discovery. While reverse engineering of semiconductor memory devices might be possible to discover the stored data, the cost to do so is very high as it requires specialized equipment to reveal physical circuit elements. Furthermore, companies who specialize in reverse engineering of semiconductor devices are unlikely to engage in the illicit act of unauthorized access of such sensitive data.

There has arisen a form of reverse engineering that can be used to partially determine the stored data in the memory device. This technique is referred to as power signature analysis, in which the power supply of the semiconductor memory device or the system the memory device is a part of, is monitored as the system is operated to execute various functions. The principle here is that particular data read out may exhibit a power consumption level that changes when different data states are read out, eventhough the actual data being read out is not known. So, as different read operations are executed by the memory device, power consumption will occur and the power supply will exhibit variations in its level. Patterns of the power supply variations can be correlated with particular functions over time (a clock signal), and when sufficient data is accumulated, analysis of the patterns may provide a clue as to the logic states of the data that is being accessed.

To illustrate the power signature problem with current memory devices, reference is made to FIG. 1. FIG. 1 is a schematic showing a known memory array and output path circuitry. The memory array is represented by bitlines BL0 to BL7 and a wordline WL, and it is assumed there is one memory cell connected at the intersection of the wordline WL with each bitline. Those skilled in the art understand that a memory array can include more than one wordline and the eight bitlines shown in FIG. 1. The memory array can consist of non-volatile or volatile memory cells. Bitlines BL0-BL3 are connected to a first column selection circuit 10 represented by a multiplexor/demultiplexor symbol, while bitlines BL4-BL7 are connected to a second column selection circuit 12 represented by multiplexor/demultiplexor symbol. Column selection circuits 10 and 12 are controlled by column selection signals (not shown) to couple one bitline to a databus line DB0 and DB1.

To read data, sense amplifiers 14 and 16 each compares voltages on DB0 and DB1 respectively against a reference voltage VREF for output on ports Q0 and Q1. The VREF voltage is set to a voltage level to distinguish a bitline voltage as being representative of a logic "1" or a logic "0". This is more commonly known as single ended sensing. Output port Q0 outputs one bit of data, while output port Q1 outputs a second bit of data. To write data, write drivers 18 and 20 receive write data from input ports D0 and D1 for application to DB0 and DB1. The column selection circuits 10 and 12 are again controlled by selection signals to couple DB0 and DB1 to selected bitlines, where WL is driven to access the memory cells to effect storage of the data to the memory cells connected to the selected bitlines. Elements 10, 12, 14 and 16 can be considered the output path circuitry of FIG. 1.

An example read operation timing diagram for the circuit of FIG. 1 is shown in FIG. 2, where successive bits are read out from output ports Q0 and Q1 at each clock cycle CLK. In this example, power consumption occurs in the memory array and in the sense amplifiers 14 and 16 each time Q0 (or Q1) transitions from a low logic state to a high logic state. Furthermore, different power consumption can occur during high to low level transitions versus low to high level transitions. As shown in FIG. 2, there may be one level of power consumption when just a single output port transitions to the high logic state, a different level of power consumption when neither output port transitions to the high logic state, and yet another different level of power consumption when both output ports transition to the high logic state. While the instantaneous power consumption at a particular clock cycle can be monitored, the sequence of transitions of the output ports over successive clock cycles can also be used to determine a power signature of the memory device.

It is, therefore, desirable to provide a memory device configured to suppress any power signature during read operations.

SUMMARY

It is an object of the present disclosure to obviate or mitigate at least one disadvantage of previous semiconductor devices.

In a first aspect, the present disclosure provides a semiconductor device having a memory array and output path circuitry. The memory array has memory cells connected to bitlines and wordlines for providing a bit of data in a read operation on at least one bitline. The output path circuitry is coupled to the bitlines and configured to sense the bit of data from the at least one bitline. The output path circuitry has first and second output ports configured to be selectively driven to a reset voltage level in response to a control signal before the at least one bitline is sensed, and configured to output the sensed bit of data by driving one of the first and second output ports to a voltage level corresponding to the sensed bit of data. The reset voltage can be one of first voltage supply level (VDD) and a second voltage supply level (VSS).

According to a present embodiment, the memory array is configurable to store the bit of data in a single memory cell corresponding to one logic state, or in at least two memory cells corresponding to complementary logic states. In an aspect of the present embodiment, the memory array is configurable to store the bit of data in a first pair of memory cells corresponding to the complementary logic states, and a second pair of memory cells corresponding to the complementary logic states. Alternatively, the memory array is configurable to store the bit of data in a first pair of memory cells corresponding to the complementary logic states, and a second pair of memory cells corresponding to the inverted complementary logic states. In the present embodiment, a first portion of the memory array is configured to store data as single memory cell per bit and a second portion of the memory array is configured to store data in at least two memory cells per bit. In the embodiment where the memory array is configured to store the bit of data in a single memory cell, the control signal may be inhibited to prevent the first and the second output ports from being driven to a reset voltage level, and the output path circuitry outputs the sensed bit of data on the first output port and senses another bit of data from another bitline for output on the second output port. In the embodiment where the memory array is configured to store the bit of data in at least two memory cells, the output path circuitry includes reset circuits each configured to drive the first output port and the second output port to the reset voltage level in response to the control signal.

In the presently described embodiments, the reset circuits include a first transistor device connected between the first output port and the reset voltage, and a second transistor device connected between the second output port and the reset voltage, each of the first and second transistor devices having gate terminals for receiving the control signal. Alternately, the reset circuits include a first latch connected to the first output port, and a second latch connected to the second output port, each of the first and second latches being resettable by the control signal to drive the first output port and the second output port to the reset voltage.

According to another embodiment of the first aspect, the output path circuitry includes bitline selectors and a sense amplifier block. The bitline selectors couple a first bitline to a first databus and a second bitline to a second databus. The sense amplifier block is selectively operable in a single ended sensing mode and a differential sensing mode for sensing voltages on the first databus and the second databus, and configured to drive the first and second output ports to either the first voltage supply level (VDD) or the second voltage supply level (VSS). In this embodiment, the sense amplifier block includes output latch circuits each configured to drive the first output port and the second output port to the reset voltage level in response to the control signal.

Furthermore, the sense amplifier block can include a first single ended sense amplifier, a second single ended sense amplifier, a differential sense amplifier and output selectors. The first single ended sense amplifier is operable in the single ended sensing mode and configured to compare the first databus voltage to a reference voltage to provide a first single ended output. The second single ended sense amplifier is operable in the single ended sensing mode and configured to compare the second databus voltage to the reference voltage to provide a second single ended output. The differential sense amplifier is operable in the differential sensing mode and configured to compare the first databus voltage to the second databus voltage to provide differential outputs. The output selectors are configured to couple the first single ended output and the second single ended output to the output latch circuits in the single ended sensing mode, and configured to couple the differential outputs to the output latch circuits in the differential sensing mode.

Alternately, the sense amplifier block can include a first differential sense amplifier, a second differential sense amplifier and first reference selectors. The first differential sense amplifier has a first input connected to the first databus, a second input connected to a first reference node, and a first output. The second differential sense amplifier has a first input connected to the second databus, a second input connected to a second reference node, and a second output. The first output and the second output are connected to the output latch circuits. The first reference selectors couple a reference voltage to the first reference node and the second reference node in the single ended sensing mode, and couple the second databus to the first reference node and the first databus to the second reference node in the differential sensing mode.

In this embodiment, the reference selectors are further configured to couple a third bitline to the first reference node and to couple a fourth bitline to the second reference node in a second differential sensing mode, where the first bitline and the third bitline carry voltages corresponding to first complementary data, and the second bitline and the fourth bitline carry voltages corresponding to second complementary data. According to the present embodiment, the first complementary data and the second complementary data represent the same bit of data, and the first differential sense amplifier senses the first complementary data to output a true state of the bit of data and the second differential sense amplifier senses the second complementary data to output a complement of the true state.

According to yet another embodiment of the first aspect, the output path circuitry includes bitline selectors, a first differential sense amplifier, a second differential sense amplifier, a first output latch circuit and a second output latch circuit, and reference selectors. The bitline selectors are configured to selectively couple one of a first bitline and a second bitline to a first databus, and to selectively couple one of a third bitline and a fourth bitline to a second databus. The first differential sense amplifier has a first input connected to the first databus, a second input connected to a first reference node, and a first output. The second differential sense amplifier has a first input connected to the second databus, a second input connected to a second reference node, and a second output. The first output latch circuit and the second output latch circuit are each configured to drive the first output port and the second output port to the reset voltage level in response to the control signal. The reference selectors are configured to selectively couple one of a reference voltage, the second bitline and the second databus to the first reference node, and to selectively couple one of the reference voltage, the third bitline and the first databus to the second reference node.

In a second aspect, the present disclosure provides method for reading data from a memory device. The method includes resetting differential outputs to a first voltage level; executing a read operation from a memory array of the memory device; and, driving one of the differential outputs to a second voltage level in response to the data read from the memory array. Resetting can include driving differential outputs to the first voltage level, or resetting can include resetting latch circuits connected to the differential outputs. According to an embodiment, executing the read operation includes asserting a wordline of the memory array, and activating at least one sense amplifier after asserting the wordline. Resetting the differential outputs can occur before activating the at least one sense amplifier, and concurrently to asserting the wordline.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a method and system for suppressing power signature in a memory device during read operations. A memory array stores data in an even number of cells per bit, such as 2 cells per bit, where complementary data states are stored in each pair of cells. Differential access of the memory array via the bitlines suppresses power signature because the same power consumption occurs regardless of the data being accessed. Data output buffers that provide complementary data to a downstream circuit system are reset to the same logic state during every read operation such that only one output buffer is ever driven to the opposite logic state in each read cycle. Hence the power consumption remains the same regardless of the data states being read out from the memory array and provided by the output buffers. This further results in the advantage of removing a detectable sequence of power signatures.

Furthermore the techniques described in the present embodiments not only hides a power signature within the memory device itself, but it also provides a 'view' for co-blocks to receive or write power-signature-independent data. In other words, neighbouring circuit blocks which are not part of the memory circuits but integrated on the same chip can also hide power signatures of complementary data they receive or provide if they are designed to do so within their structure.

Figure 1:
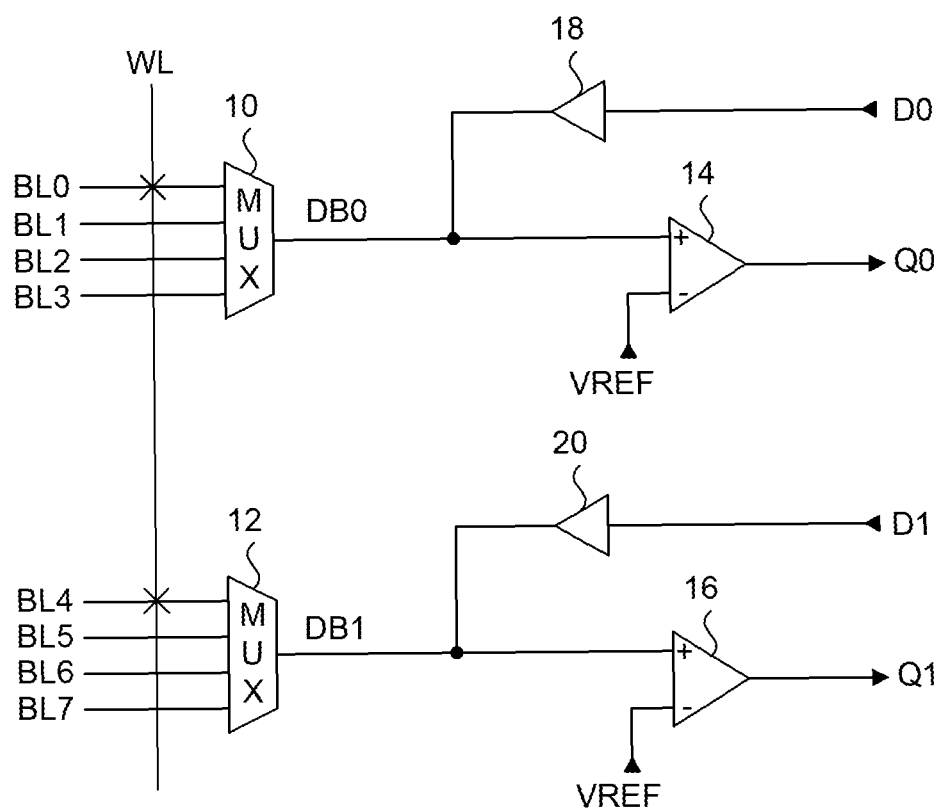
FIG. 1 is a circuit schematic of a memory array with output path circuitry of the prior art.
Figure 2:
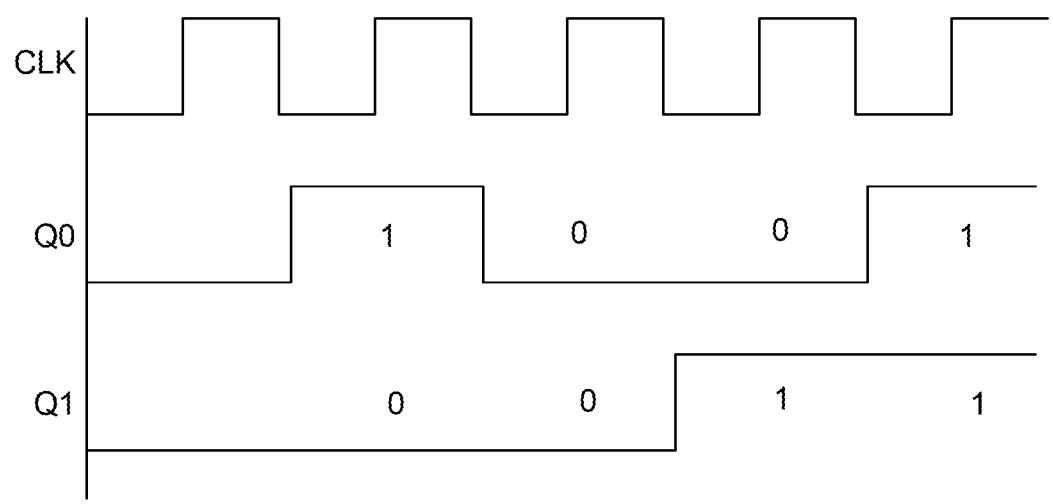
FIG. 2 is a timing diagram showing an example operation of the output path circuitry of FIG. 1.
Figure 3:
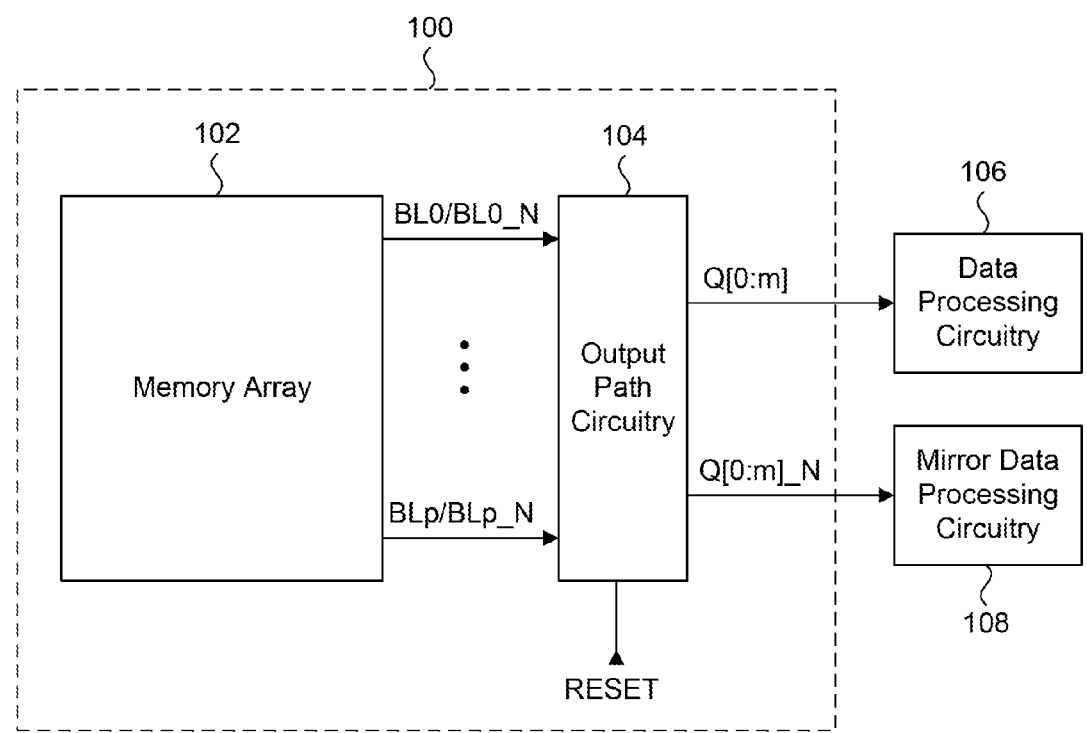
FIG. 3 is a block diagram of a memory device with power signature suppression, according to a present embodiment.

FIG. 3 is a block diagram of a memory device with power signature suppression, according to a present embodiment. Memory device 100 includes a memory array 102 having memory cells connected to bitlines and wordlines, where at least two memory cells are used to store a single bit of data as complementary data states or each memory cells stores a single bit of data. The memory cells can be volatile or non-volatile memory cells. Using two cells to store a single bit of data as complementary logic states is well known in the art, and therefore not discussed in further detail. Accordingly, the physical bitlines are logically referred to as complementary bitlines BL0/BL0_N to BLp/BLp_N, where "p" is an integer number representing the last bitlines and "N" designates a complementary bitline. Therefore voltages on each pair of BL/BL_N bitlines represents a single bit of data. Output path circuitry 104 outputs read data from the memory array 102 onto differential ports Q[0:m]/Q[0:m]_N, where "m" is an integer number representing the last output ports, and "N" designates a complementary output port. As will be described in further detail later, output path circuitry 104 employs differential sensing for comparing voltages of complementary bitlines to each other or single ended sensing for comparing voltages of bitlines to a reference voltage.

Therefore each pairing of Q/Q_N output ports provides output voltages representing a single bit of data. The output path circuitry 104 receives a reset signal RESET that is activated at a specific time during a read operation from the memory array 102 to suppress any power signature during outputting of data from the Q/Q_N output ports. Further details of where and how this reset signal is used by output path circuitry 104 is discussed in further detail later.

The memory device 100 will include other circuits that are required to ensure proper operation, but these are not shown in FIG. 3 as they are not relevant to the present embodiments. The memory device 100 can be a stand-alone semiconductor chip or it can be integrated on a system on a chip having other downstream circuits. Example downstream circuits include data processing circuitry 106 that receives the true data and mirror data processing circuitry 108 configured to be the same as data processing circuitry 106 that receives the complement of the true data.

According to the present embodiments, the memory array 102 and output path circuitry 104 do not exhibit any power signature that could be used to help discern the data being output during any read operation. Regardless of the state of data being read out, the memory array 102 consumes the same power and the output path circuitry 104 consumes the same power since there is always logic "1" and logic "0" output in each read cycle. To further suppress power signature in a larger integrated system, the mirror processing circuitry 108 functions the same way as the actual data processing circuitry 106 so that one of the two circuits 106 or 108 is always operating regardless of the output data.

Figure 4:
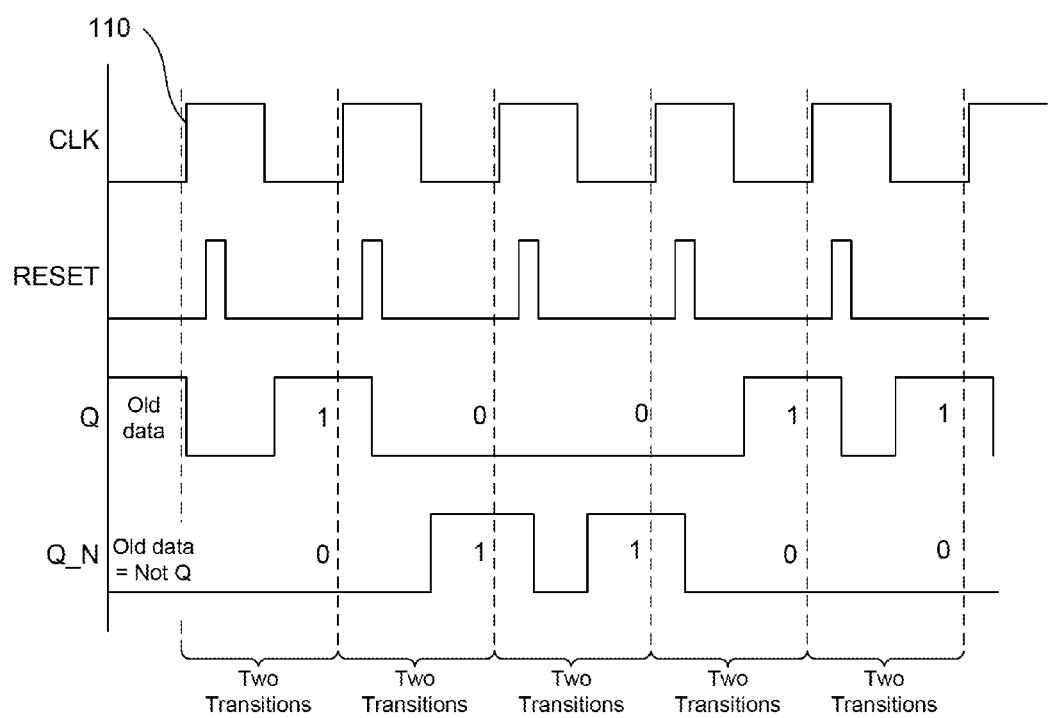
FIG. 4 is a timing diagram showing an example operation of the output path circuitry of FIG. 3.

FIG. 4 is a simplified timing diagram showing power signature suppression by the output path circuitry 104, according to a present embodiment. It is assumed that complementary states of data are read out from the memory array 102, differentially sensed and output by output path circuitry 104 on complementary ports Q and Q_N in synchronization with a clock. Also shown in FIG. 4 is the signal trace for the reset signal RESET of FIG. 3. Starting on the left side of FIG. 4, the first read operation starts at rising CLK edge 110, which initiates the read sequence that can include any required bitline precharging, wordline activation and sensing.

A first RESET pulse is issued shortly after rising edge 110 to cause both Q and Q_N output ports to be driven to a reset state of a first voltage level, in this example VSS, which represents a logic "0" state. Concurrently with or after the RESET pulse is issued, sensing of the bitline data is initiated and the output path circuitry 104 eventually drives Q and Q_N with sensed data. More specifically, Q is driven to a second voltage level, in this example VDD, which represents a logic "1" state. As it is the complement of the Q, Q_N is driven to the first voltage level of VSS. However, since Q_N was already reset to the VSS level due to RESET, there is no change to the level of Q_N relative to the previous reset state. This process repeats for the next four data read operations. It is clear that for each of the remaining four read operations, only one of Q or Q_N is driven to the second voltage level of VDD, and there are exactly two output buffer transitions within each read cycle. The two transitions are noted for each clock cycle in FIG. 4. Therefore, there is no power signature between the different data states being read out, or relative to any previous data states being read out.

Having memory array 102 configured to store data in two cells reduces the total storage capacity relative to a configuration where a data is stored in a single cell. In this particular example, the total storage capacity is reduced by 50%. Furthermore, the output data width is reduced by 50%. For example, a 64 Mb memory device configured for single cell per bit storage having a data width of 32 bits will have Q0 to Q31 output ports. Assuming the memory array and number of internal data buses remains unchanged, another version of the memory device configured for two cell per bit storage will store up to 32 Mb and have a data width reduced to 16 bits for output on ports Q0/Q0_N to Q15/Q15_N. While some applications do not require secure data storage and prefer high total storage capacity and high bandwidth, other applications may require secure data storage with power signature suppression as a higher priority.

According to a present embodiment, the memory array 102 can be configured to store data in either single cell per bit mode, two cell per bit mode, or both while the output path circuitry 104 can be selectively configurable to receive, sense and output received bitline data for either single cell per bit mode or the two cell per bit mode. This allows for a single memory device to be manufactured that can be used in different applications. A further enhancement of the two cell per bit mode is a two cell per bit mode with redundancy.

Commonly owned U.S. Pat. No. 8,213,211 discloses a memory array with bitlines and wordlines which can store data as single cell per bit or two or more cells per bit. Reference may be made to teachings of that application to see example memory array configurations allowing for different numbers of cells per bit storage modes. The following description is directed to embodiments of the output path circuitry 104 for receiving bitline voltages in either the single or two cell per bit storage modes.

Figure 5:
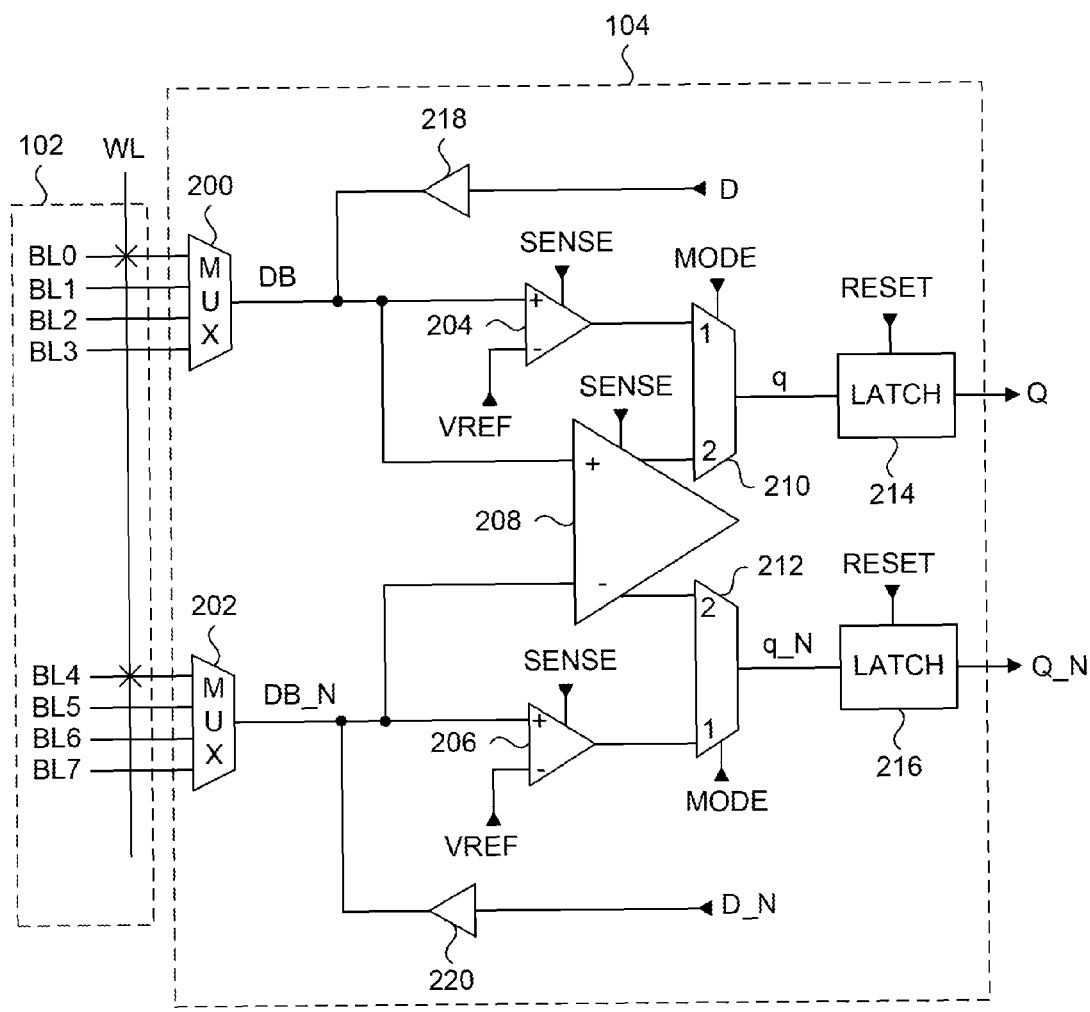
FIG. 5 is a circuit schematic of a memory array and output path circuity, according to a resent embodiment.

FIG. 5 is a circuit schematic of a first embodiment of output path circuitry 104. The bitlines BL0-BL7 and the wordline WL are representative of the memory array 102. The output path circuitry 104 of the present embodiment includes bitline selectors 200 and 202 each connected to a respective group of bitlines, single ended sense amplifiers 204 and 206, a differential sense amplifier 208, output selectors 210 and 212, and output buffers 214 and 216 connected to output ports Q and Q_N. The output buffers 214 and 216 of the present examples are shown as output latch circuits. Write drivers 218 and 220 are not part of the output path circuitry 104, but are shown for completeness. This arrangement of components shown in the dashed line of box 104 is repeated for all other groups of bitlines of memory array 102, and it is assumed that memory array 102 is configured to have an even number of such bitline groups. Following is a more detailed explanation of the previously mentioned components.

The memory array 102 is configured to store data as single cell per bit or two cell per bit. Activation of a wordline in a read operation accesses all cells connected to it. Bitline selectors 200 and 202 function as column select circuits, and receive the same decoded column address signals (not shown) for each selecting one bitline to connect to respective databuses DB and DB_N. There can be any number of bitlines connected to each of bitline selectors 200 and 202. Databus DB is connected to one input of single ended sense amplifier 204 and connected to a first input of differential sense amplifier 208. The other input of single ended sense amplifier 204 receives a reference voltage VREF. Similarly, databus DB_N is connected to one input of single ended sense amplifier 206 and connected to a second input of differential sense amplifier 208. The other input of single ended sense amplifier 206 receives the reference voltage VREF.

The output of single ended sense amplifier 204 is provided to a first input of output selector 210 and a first output of differential sense amplifier 208 is provided to a second input of output selector 210. Similarly, the output of single ended sense amplifier 206 is provided to a first input of output selector 212 and a second output of differential sense amplifier 208 is provided to a second input of output selector 212. All the sense amplifiers shown in FIG. 5 are enabled by a sense enable signal SENSE to compare its inputs and for providing a corresponding resulting output. Output selectors 210 and 212 receive a mode control signal MODE to select which of its inputs to couple to latch 214 and 216 respectively via the intermediate outputs q and q_N. The output selectors 210 and 212 are shown having input positions labelled with numerals 1 and 2, such that signal MODE in one state selects inputs 1 while signal MODE in another state selects inputs 2, for passage to the output. While not labelled with inputs 1-4, the bitline selectors 200 and 202 are also similarly configured to select the same input in response to the same decoded column address signals. From this point forward, any selector having numbered input positions should be understood to function as described above. Each output latch circuit 214 and 216 receives a reset signal RESET and are connected to output ports Q and Q_N. The write circuitry consisting of write drivers 218 and 220 receive write data from input ports D and D_N for driving onto DB and DB_N respectively.

The output path circuitry 104 embodiment of FIG. 5 can operate in either a single ended mode or a differential mode, depending on how data is stored in memory array 102. Following is an example of the differential mode read operation where power signature is suppressed, with reference to the timing diagram of FIG. 6. The timing diagram of FIG. 6 includes signal traces for all the signals shown in FIG. 5. The signal traces for the bitlines, databuses and output ports generically represents the cases where the stored data is a logic "1" or logic "0".

In the present example, it is assumed that the memory array consists of anti-fuse memory cells, such as the ones disclosed in commonly owned U.S. Pat. No. 8,213,211 by example, and that two memory cells store one bit of data as complementary data states. Therefore memory cells connected to bitlines BL0-BL3 store one state of the bits and bitlines BL4-BL7 store the complementary state of the bits. In the present example, it is assumed that BL0 and BL4 are selected for connection to respective databuses DB and DB_N, which is shown in FIG. 5 by the "X" positioned over the intersecting lines of BL0, BL4 and WL. Also, control signal MODE is set to one logic state to enable output selectors 210 and 212 to select only the outputs from differential sense amplifier 208 to couple to output latch circuits 214 and 216. It is further assumed that the bitlines and the databuses DB/DB_N are precharged to VSS with precharge circuitry (not shown).

The read operation begins shortly after the rising edge of CLK, where WL is activated. At about this same time, the RESET signal is asserted as a pulsed signal. The RESET signal causes all the output latch circuits 214 and 216 to reset to the VSS voltage level. It is noted that RESET can be asserted anytime before the sense amplifiers are triggered, or enabled, which in the present embodiments is before the rising edge of SENSE. The activated wordline causes one of the selected bitlines precharged to VSS to rise to a high voltage, while the other bitline remains at about the VSS precharge voltage level. At a predetermined time, the bitline selectors 200 and 202 are activated by column select signals to couple the selected bitlines to DB and DB_N, at which point one of DB or DB_N will rise to a high voltage level. This predetermined time can be calibrated based on when the sense amplifiers 204, 206 and 208 are to be activated by SENSE, to allow sufficient voltage to develop on DB/DB_N. In the present example, the bitline selectors 200 and 202 can be activated concurrent with or after the rising edge of CLK or WL. At the falling edge of CLK, the SENSE is asserted to turn on all the sense amplifiers.

The inputs to differential sense amplifier 208 are sensed and the voltages on DB and DB_N are driven to complementary high and low voltage levels, where one of DB and DB_N will reach the full voltage rail level when the sense amplifier 208 is activated. The complementary outputs of differential sense amplifier 208 are then latched by output latch circuits 214 and 216 for output on the Q and Q_N ports. Because the output latch circuits 214 and 216 were reset after the read operation was initiated and prior to sensing by differential sense amplifier 208, only one output latch circuit 214 or 216 ever drives its output to the high logic level. The next read cycle would commence on the next rising edge of CLK, and the process repeats as previously described for the first read operation. Therefore suppressed power signature is exhibited regardless of the data being accessed and the sequence of data being read out.

In the presently shown embodiment of FIG. 5, the same SENSE signal is used to enable the single ended sense amplifiers 204, 206 and the differential sense amplifier 208. In an alternate embodiment, the MODE signal can be logically combined with a master sense signal to generate separate two distinct sense signals—one for enabling just the single ended sense amplifiers 204, 206 and another for enabling just the differential sense amplifier 208.

To operate the output path circuitry 104 in the single ended mode, the MODE signal is changed to a logic state corresponding to single ended operation so that only the outputs of single ended sense amplifiers 204, 206 are coupled to output latch circuits 214 and 216. In the single ended mode, the RESET signal is not used and remains in an inactive state. In the single ended mode, databuses DB and DB_N are now logically treated as DB0 and DB1, while output ports Q and Q_N are now logically treated as Q0 and Q1. This is because the data read from the cells connected to bitlines BL0 and BL4 now store independent data bits.

The output path circuitry embodiment of FIG. 5 uses dedicated single ended and differential sense amplifiers. According to the alternate embodiment of FIG. 7, a differential sense amplifier can be used for both single ended and differential sensing operations.

Figure 7:
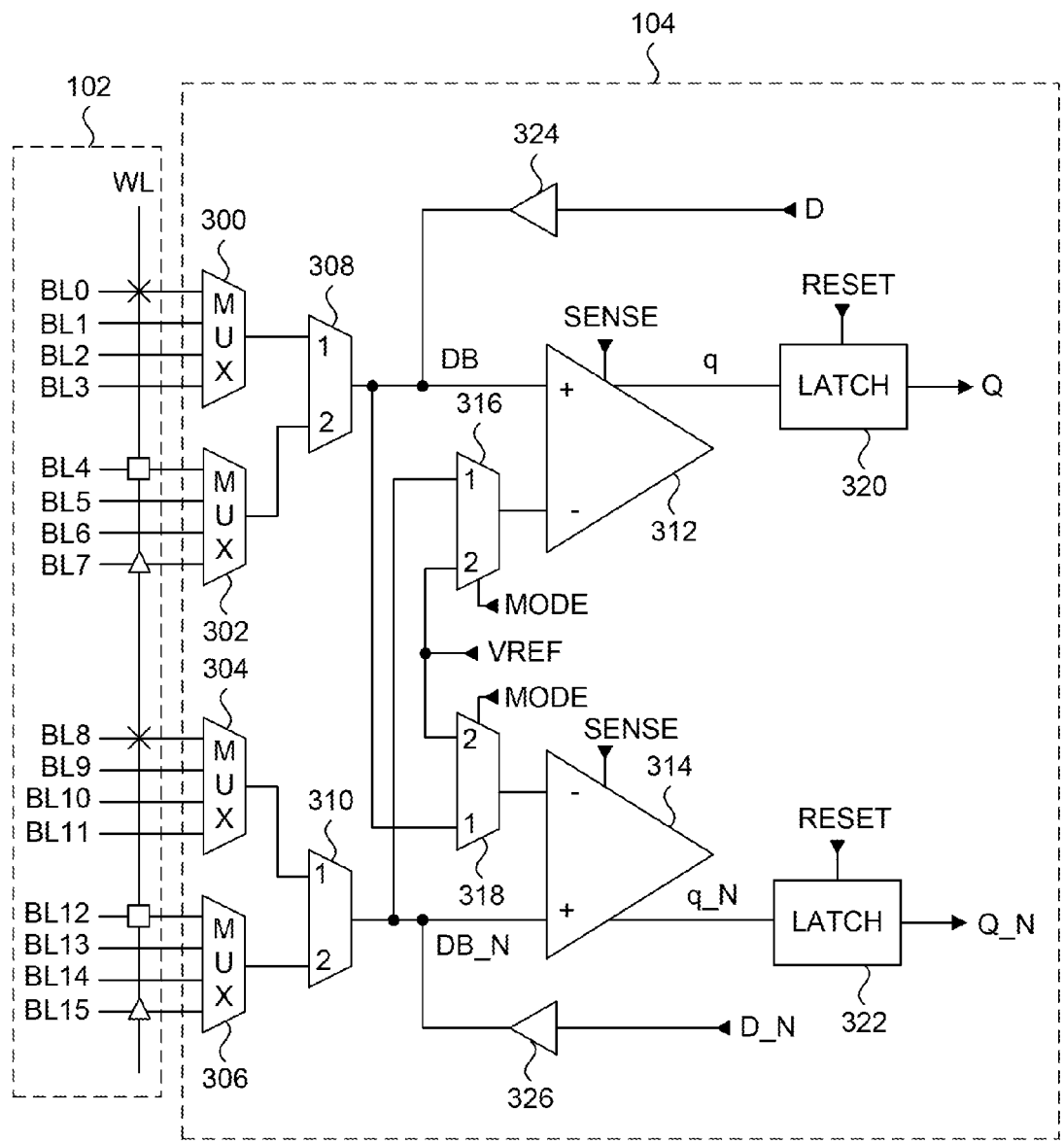
FIG. 7 is a circuit schematic of a memory array and output path circuity, according to an alternate embodiment.

FIG. 7 is a circuit schematic of a second embodiment of output path circuitry 104. The bitlines BL0-BL15 and the wordline WL are representative of the memory array 102. The output path circuitry 104 of the present embodiment includes first stage bitline selectors 300, 302, 304 and 306 each connected to a respective group of bitlines, second stage bitline selectors 308 and 310, differential sense amplifiers 312 and 314 having outputs q and q_N, reference selectors 316 and 318, and output latch circuits 320 and 322 connected to output ports Q and Q_N. In variations of the present embodiment, the output latch circuits 320 and 322 can be integrated together with the differential sense amplifiers 312 and 314 respectively. Write drivers 324 and 326 are not part of the output path circuitry 104, but are shown for completeness. This arrangement of components shown in the dashed line of box 104 is repeated for all other groups of bitlines of memory array 102, and it is assumed that memory array 102 is configured to have an even number of such bitline groups. Similar to the embodiment of FIG. 5, there can be any number of bitlines connected to each of the first stage bitline selectors. The elements shown in the dashed line of box 104 are collectively referred to as a mixed sensing block, which can be operated in the single ended or differential sensing modes. Within the mixed sensing block are first and second single ended sensing units. The first such unit consists of elements 300, 302, 308, 316, 312 and 320. The second such unit consists of elements 304, 306, 310, 318, 314 and 322.

Following is a more detailed explanation of the previously mentioned components.

The memory array 102 is configured to store data as single cell per bit or two cell per bit. Activation of a wordline in a read operation accesses all cells connected to it. First stage bitline selectors 300, 302 and second stage bitline selector 308 function as column select circuits, and receive decoded column address signals (not shown) for selecting one bitline of BL0 to BL7 to connect to databus DB. Similarly, first stage bitline selectors 304, 306 and second stage bitline selector 310 receive the same decoded column address signals (not shown) for selecting one bitline of BL8 to BL15 to connect to databus DB_N.

Databus DB is connected to one input of differential sense amplifier 312 and connected to a first input of reference selector 318. Databus DB_N is connected to one input of differential sense amplifier 314 and connected to a first input of reference selector 316. Reference selectors 316 and 318 each have a second input receiving a reference voltage VREF, and is controlled by signal MODE. The output of reference selector 316 is provided to a second input of differential sense amplifier 312 and the output of reference selector 318 is provided to a second input of differential sense amplifier 314. Differential sense amplifier 312 has its true output connected to output latch circuit 320, while differential sense amplifier 314 has its true output connected to output latch circuit 322. The complementary outputs of the differential sense amplifiers 312 and 314 are not used in this embodiment.

All the differential sense amplifiers shown in FIG. 7 are enabled by a sense enable signal SENSE to compare its inputs and for providing a corresponding resulting output. Depending on the state of MODE, the differential sense amplifiers will compare the databus voltage on their true inputs to either VREF or to the other databus voltage. For example, differential sense amplifier 312 either compares DB from its true input to VREF or to DB_N. Each output latch circuit 320 and 322 receives a reset signal RESET and are connected to output ports Q and Q_N. The write circuitry consisting of write drivers 324 and 326 receive write data from input ports D and D_N for driving onto DB and DB_N respectively.

The output path circuitry 104 embodiment of FIG. 7 can operate in either a single ended mode or a differential mode, in a manner very similar to that of FIG. 5. In the embodiment of FIG. 7, it is assumed that only one bitline of the first group of bitlines BL0-BL7 is coupled to DB and only one bitline of the second group of bitlines BL8-BL15 is coupled to DB_N via the first and second stage bitline selectors for both differential and single ended modes. Two stage selection of bitlines is well known in the art.

In the differential mode of operation, it is assumed memory cells connected to bitlines BL0-BL7 store one state of the bits and bitlines BL8-BL15 store the complementary state of the bits. In the present example, BL0 and BL8 are accessed which means that the cells they are connected to store complementary states of a bit of data. In FIG. 7, the "X" positioned over the intersecting lines of BL0, BL8 and WL shows this pairing of bitlines for the differential mode of operation. Of course, other bitline pairings are possible in the embodiment of FIG. 7. For example, the triangle shapes at the cross points of BL7, BL15 and WL show another valid pairing of bitlines for the differential mode of operation, as does do the square shapes at the cross points of BL4, BL12 and WL.

Figure 6:
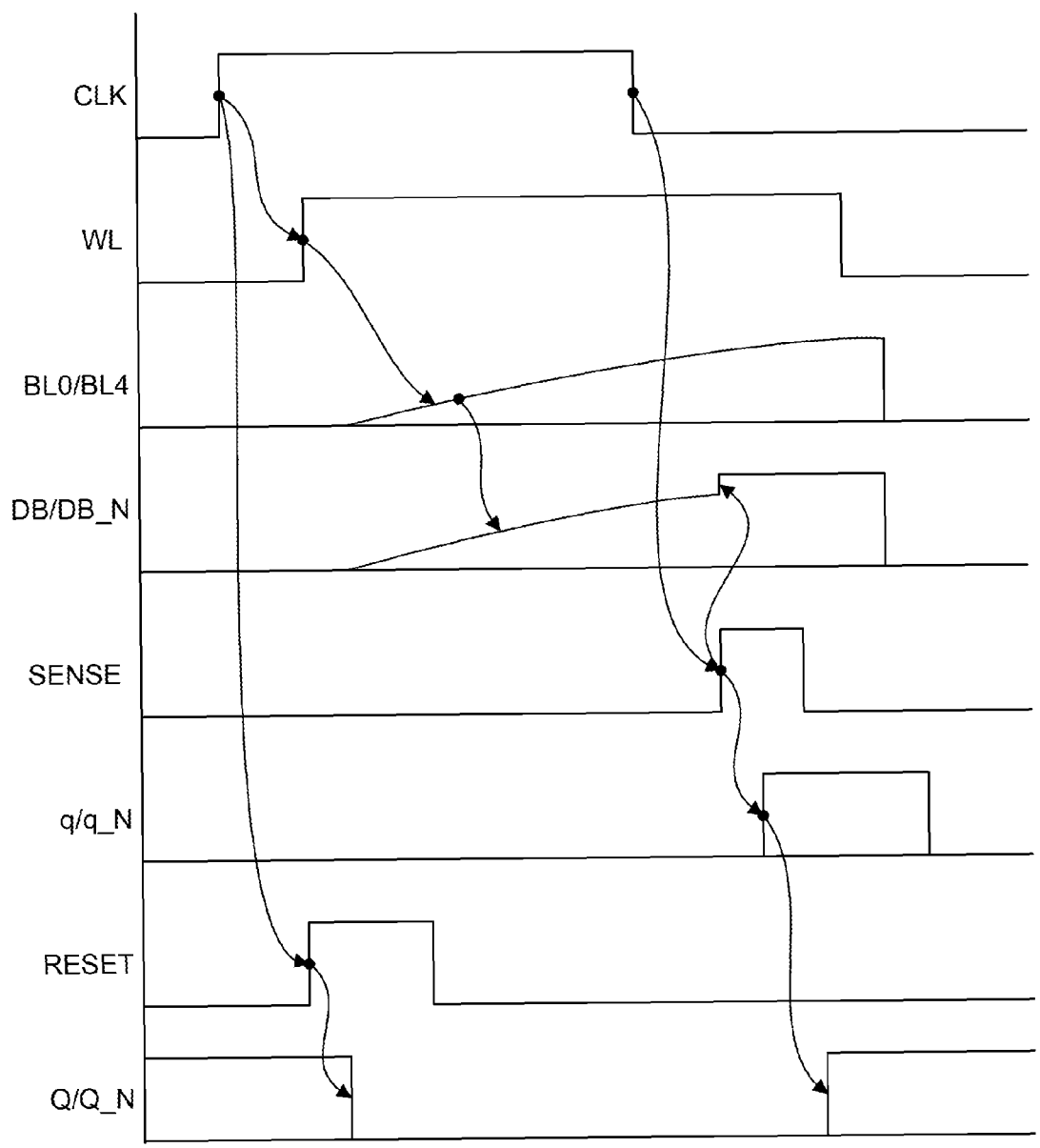
FIG. 6 is a timing diagram showing an example operation of the output path circuit of FIG. 5.

The read operation sequence is the same as shown in the timing diagram of FIG. 6. During a read operation, RESET is asserted to drive Q and Q_N to VSS. DB and DB_N carry voltages corresponding to complementary data states of the bit accessed from the memory array 102. Reference selectors 316 and 318 are controlled by MODE in the differential mode to couple DB_N to differential sense amplifier 312 and to couple DB to differential sense amplifier 314. The differential sense amplifiers 312 and 314 are activated by asserting sense signal SENSE. The sensed true outputs from each differential sense amplifier is then provided to output latch circuits 320 and 322, where only one drives its output to the high logic level. Accordingly, each single ended sensing unit senses a voltage of one bitline connected to its first stage bitline selectors and one bitline connected to first stage bitline selectors of the second single ended sensing unit, and vice versa.

The single ended mode of operation differs only in that the memory cells connected to BL0 and BL8 each store their own bit of data, and MODE is set to a different logic state such that the voltage on DB is compared to VREF and the voltage on DB_N is compared to VREF. Once again, RESET is not asserted in the single ended mode of operation. Accordingly, each single ended sensing unit senses a voltage of one bitline connected to its first stage bitline selectors.

In the embodiment of FIG. 7, single ended sensing or differential sensing with differential output modes of operation are possible. According to an alternate embodiment to the output path circuitry of FIG. 7, the output path circuitry 104 can be configured to provide single ended sensing, differential sensing with differential output, and differential sensing with single ended output.

Figure 8A:
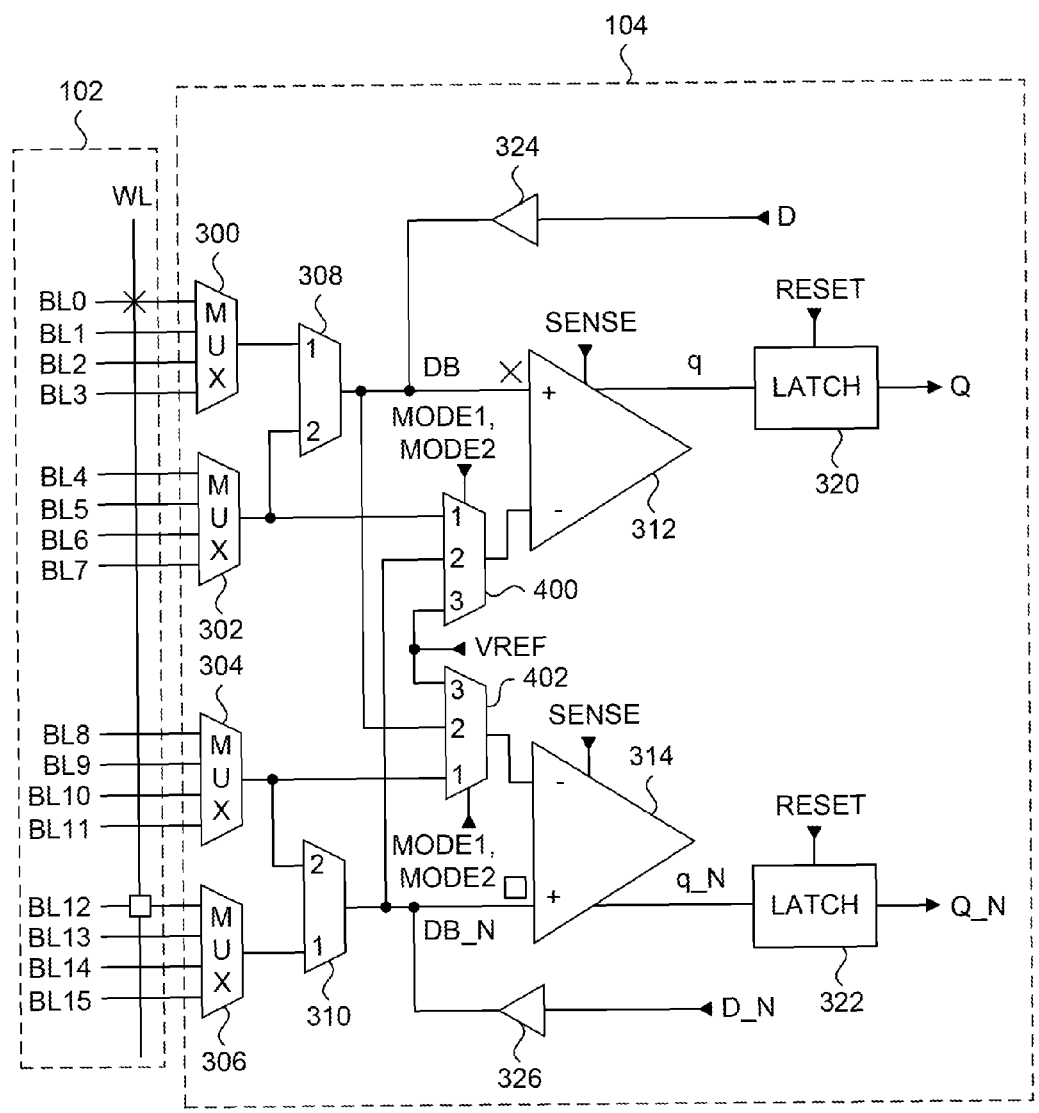
FIGS. 8A, 8B, 8C, 8D, 8E and 8F are circuits schematics of a memory array and output path circuity shown operating in different modes, according to yet another alternate embodiment.

FIG. 8A is a circuit schematic of a third embodiment of output path circuitry 104. The elements shown in the circuit of FIG. 8A are similar to those shown in the embodiment of FIG. 7, and therefore the same reference numbers designate the same elements which function in the same ways as previously described for FIG. 7. The elements shown in the dashed line of box 104 are collectively referred to as a mixed sensing block, which can be operated in the single ended or differential sensing modes. Within the mixed sensing block are first and second single ended sensing units. The first such unit consists of elements 300, 302, 308, 400, 312 and 320. The second such unit consists of elements 304, 306, 310, 402, 314 and 322.

The circuit differences between the embodiments of FIGS. 7 and 8A are now described in detail.

In the embodiment of FIG. 8A, the memory array 102 is the same as the memory array 102 described in the embodiment of FIG. 7. For the purposes of the following discussion, bitlines BL0-BL3 are referred to as a first bitline group, bitlines BL4-BL7 are referred to as a second bitline group, bitlines BL8-BL11 are referred to as a third bitline group, and bitlines BL12-BL15 are referred to as a fourth bitline group. In the embodiment of FIG. 8A, reference selectors 400 and 402 replace reference selectors 316 and 318 of FIG. 7. The first reference selector 400 has a first input receiving a reference voltage VREF, a second input connected to DB_N for receiving its voltage, and a third input connected to the output of first stage bitline selector 302 for receiving a voltage of one of bitlines BL4-BL7. Similarly, second reference selector 402 has a first input receiving a reference voltage VREF, a second input connected to DB for receiving its voltage, and a third input connected to the output of first stage bitline selector 304 for receiving a voltage of one of bitlines BL8-BL11. Reference selector 400 receives control signals MODE1 and MODE2 for selecting one of its three inputs to couple to an input of differential sense amplifier 312. Reference selector 402 receives the same control signals MODE1 and MODE2 for selecting one of its three inputs to couple to an input of differential sense amplifier 314. MODE1 and MODE2 can be decoded by logic circuits within reference selectors 400 and 402 to perform a 1 of 3 selection operation, as should be well understood by those skilled in the art.

The operation modes of the present embodiment are now described in further detail with reference to FIGS. 8A, 8B, 8C, 8D and 8E. FIGS. 8A, 8B, 8C, 8D and 8E show identical circuitry, except for annotations showing example bitlines which are accessed in the different modes of operation.

The single ended mode of operation in FIG. 8A is the same as previously described for the embodiment of FIG. 7, except that the MODE1 and MODE2 signals are set to enable reference selectors 400 and 402 to couple VREF to the respective inputs of differential sense amplifiers 312 and 314. Therefore, a bitline from the first bitline group of BL0-BL3 or a bitline from the second bitline group of BL4-BL7 is coupled to DB for sensing relative to VREF. Similarly a bitline from the third bitline group of BL8-BL11 or a bitline from the fourth bitline group of BL12-BL15 is coupled to DB_N for sensing relative to VREF. In a specific example, the first and second stage bitline selectors 300, 302 and 308 couple BL0 to DB, while the first and second stage bitline selectors 304, 306 and 310 couple BL8 to DB_N. For the presently shown embodiments, it is assumed that the column decoding is replicated for the first stage bitline selectors 300, 302, 304, 306 and the column decoding is replicated for the second stage bitline selectors 308 and 310. Accordingly, each single ended sensing unit senses a voltage of one bitline connected to its first stage bitline selectors. For ease of reference, the "X" at the cross point of BL0 and WL represents a memory cell storing singled ended data which ultimately appears at the input of differential sense amplifier 312, and the white box at the cross point of BL12 and WL represents a memory cell storing unrelated singled ended data which ultimately appears at the input of differential sense amplifier 314.

Figure 8B:
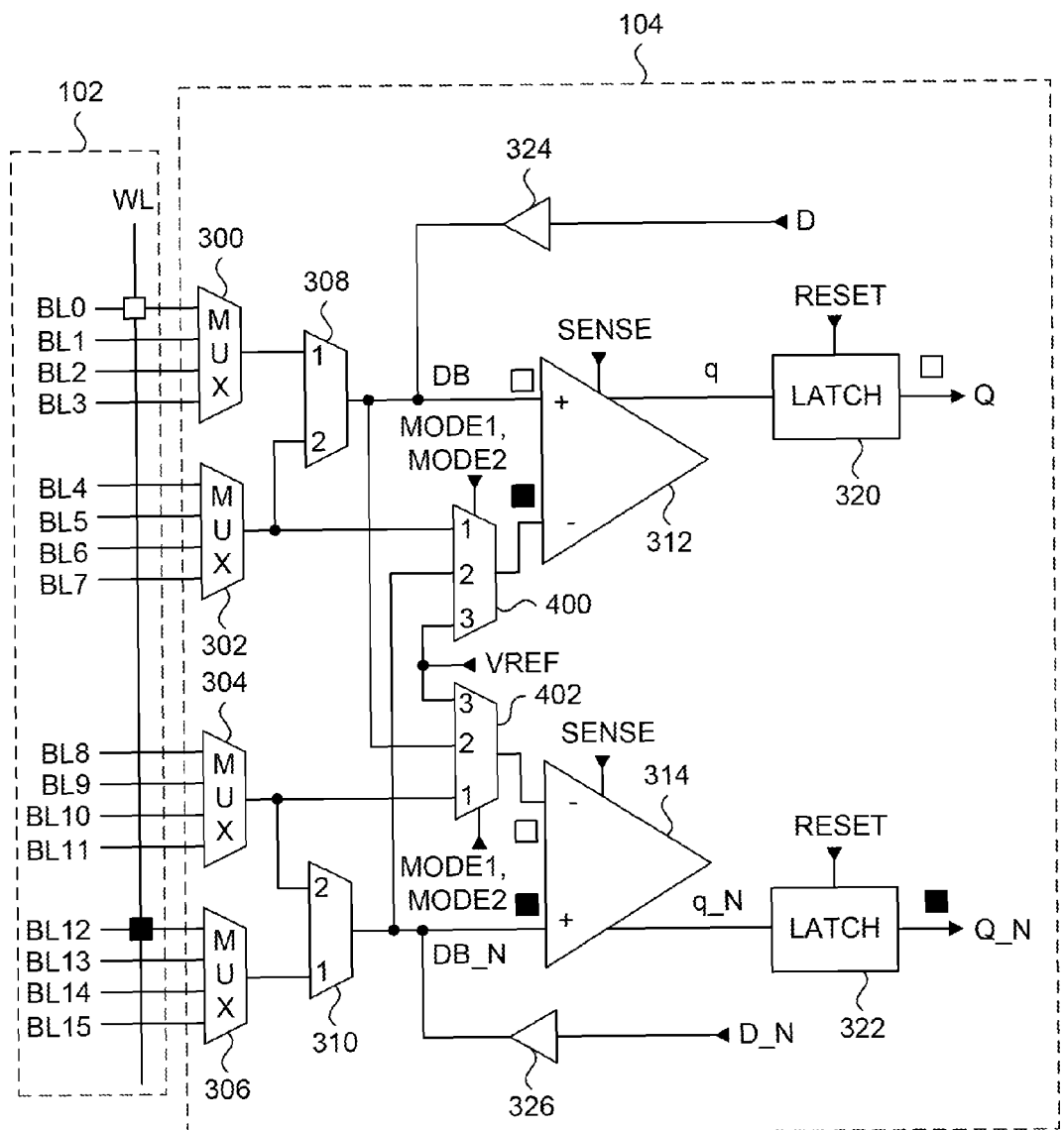

The differential sensing with differential output mode is shown by example in FIG. 8B, and is the same as the differential mode described for the embodiment of FIG. 7, except that the MODE1 and MODE2 signals are set to enable reference selectors 400 and 402 to couple DB_N to differential sense amplifier 312 and to couple DB to differential sense amplifier 314. Therefore, a bitline from the first or second bitline groups is compared to a bitline from the third or fourth bitline groups by both differential sense amplifiers 312 and 314. In a specific example, BL0 and BL12 are selected as the complementary bitlines for coupling to DB and DB_N respectively, for differential sensing and output as differential outputs Q and Q_N. As shown in FIG. 8B, a white box at the cross point of BL0 and WL represents a memory cell storing one data state and a black box at the cross point of BL12 and WL represents a memory cell storing an opposite data state to the white box, representing the differential data which ultimately appears at the inputs of differential sense amplifiers 312 and 314. Accordingly, each single ended sensing unit senses a voltage of one bitline connected to its first stage bitline selectors and one bitline connected to first stage bitline selectors of the second single ended sensing unit, and vice versa.

For the previously described differential sensing with differential output mode, one memory cell storing true data is connected to a bitline in either the first or second bitline groups, while the other memory cell storing complementary data is connected to a bitline in either the third or fourth bitline groups. In this mode of operation, the RESET signal is used as discussed in the previous embodiments.

Figure 8C:
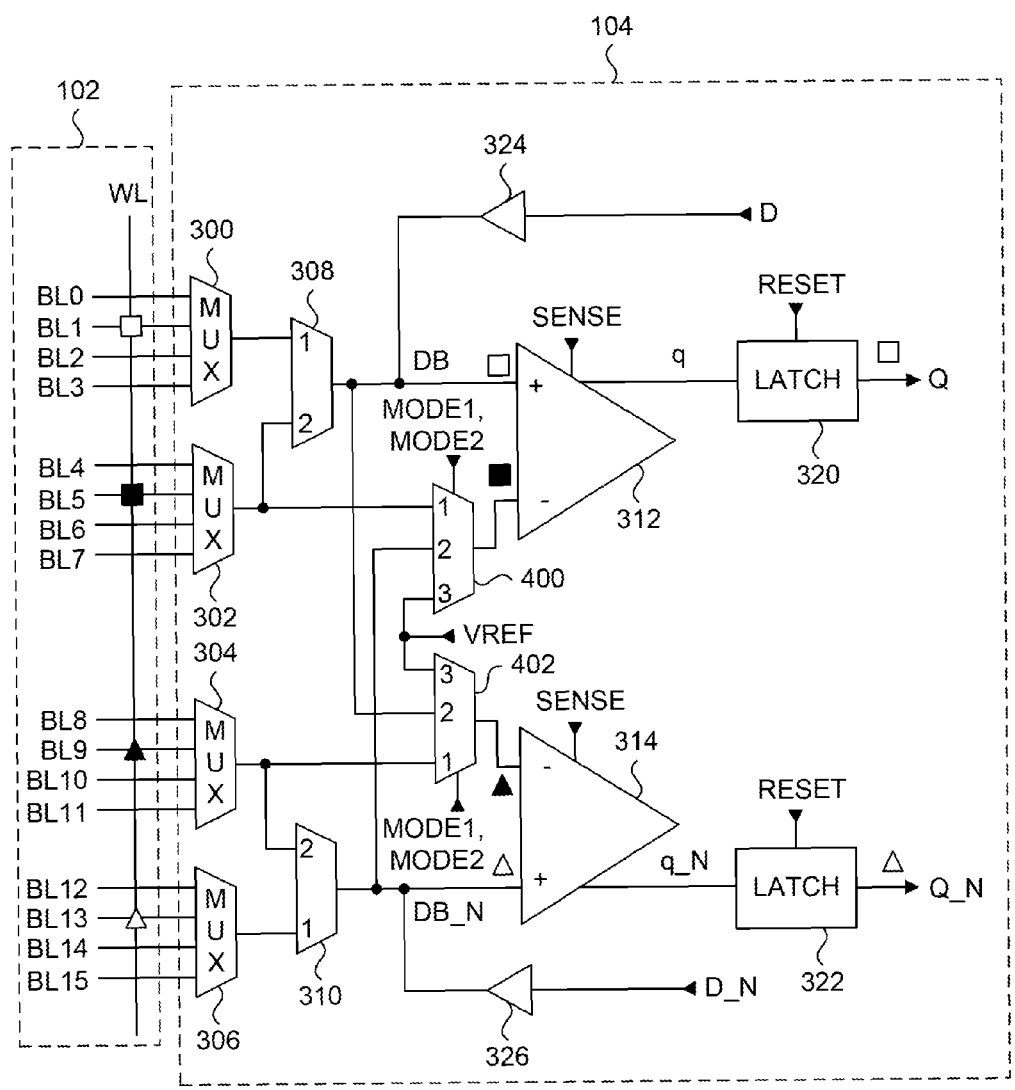

FIG. 8C illustrates another type of differential sensing mode, according to a present embodiment. In the presently described differential sensing with single ended output mode, one bit of data is stored as two cells per bit, but only a single output port provides the sensed data. One memory cell of a pair of memory cells storing complementary data for one bit is connected to a bitline in the first bitline group, while the other memory cell of the pair of memory cells is connected to a bitline in the second bitline group. Similarly, one memory cell of a pair of memory cells storing complementary data for one bit is connected to a bitline in the third bitline group, while the other memory cell of the pair of memory cells is connected to a bitline in the fourth bitline group.

In this two cell per bit storage configuration in memory array 102, MODE1 and MODE2 signals can be set to enable reference selector 400 to couple the output of first stage bitline selector 302 to one input of differential sense amplifier 312, while the first and second stage bitline selectors 300 and 308 couple a bitline from the first bitline group to the other input of differential sense amplifier 312. By example, a white box at the cross point of BL1 and WL and a black box at the cross point of BL5 and WL represents the memory cells storing the differential data which ultimately appears at the inputs of differential sense amplifier 312. Similarly, reference selector 402 is enabled by MODE1 and MODE2 to couple the output of third stage bitline selector 304 to one input of differential sense amplifier 314, while the first and second stage bitline selectors 306 and 310 couple a bitline from the fourth bitline group to the other input of differential sense amplifier 314. By example, a black triangle at the cross point of BL9 and WL represents one data state and a white triangle at the cross point of BL13 and WL represents an opposite data state to the white triangle, which are the memory cells storing the differential data that ultimately appears at the inputs of differential sense amplifier 314. Under these conditions, each differential sense amplifier 312 and 314 compares different pairs of differential bitlines to each other and outputs a single ended result from its respective output port. Accordingly, the Q and Q_N outputs do not have to have opposite logic states to each other. As for the previously described single ended sensing embodiments, the RESET signal is not asserted during any part of the read operation. Accordingly, each single ended sensing unit differentially senses voltages of complementary bitlines connected to its first stage bitline selectors to provide a single ended result.

Figure 8D:
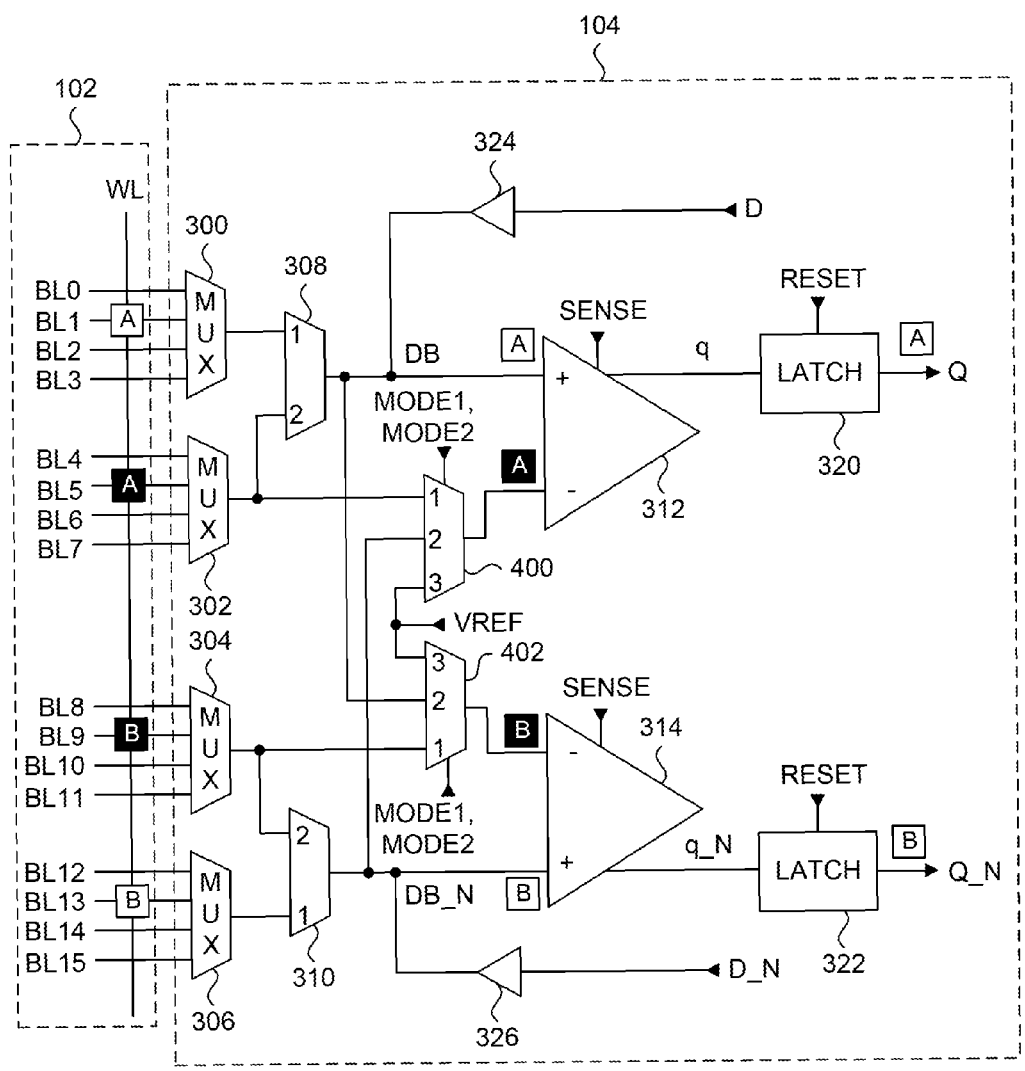

FIG. 8D illustrates a variation of the differential sensing with single ended output mode of 8C. In the differential sensing with single ended output mode, one bit of information is stored as complementary data states in cells connected to BL1 and BL5, while another different bit of information is stored as complementary data states in cells connected to BL9 and BL13. In the present redundant differential sensing mode, the same bit of information is stored in two pairs of cells each storing complementary data states. For example, a white "A" box at the cross point of BL1 and WL is true data and a black "A" box at the cross point of BL5 and WL can be the complement data, where both represents the memory cells storing the differential data corresponding to a first bit of information. Similarly, a black "B" box at the cross point of BL9 and WL is true data and a white "B" box at the cross point of BL13 and WL can be the complement data, where both represents the memory cells storing the differential data of a second bit of information being the same as the first bit of information. The data states of the two white boxes are the same while the data states of the two black boxes are the same. Accordingly, the outputs Q and Q_N should have the same logic states.

With this data storage configuration, redundancy can be provided for mission critical applications. In a read operation, the complementary "A" data are compared to each other and the complementary "B" data are compared to each other. To do this, the second stage bitline selectors 308 and 310 are controlled to couple BL1 and BL13 to DB and DB_N respectively, and reference selectors 400 and 402 can be controlled by MODE1 and MODE2 to couple BL5 to sense amplifier 312 and BL9 to sense amplifier 314. In this read mode, Q and Q_N should provide the same output if the complementary data was properly programmed to the memory cells connected to bitline pairs BL1/BL5 and BL9/BL13.

If during testing of the memory of FIG. 8D after programming, it is determined that certain memory cells could not be properly programmed, they are deemed defective and their location is noted for redundancy programming. More specifically, it would be known which of Q and Q_N provides data from a defective memory cell. Therefore in one embodiment of redundancy programming, additional switch circuitry similar to bitline selector circuit 308 connected to receive the Q and Q_N outputs can be programmed to output the non-defective data to any downstream circuit. For example, the signals controlling this additional switch circuitry can be set through fuse programming, or other programming techniques known in the art. Alternately, if the Q and Q_N outputs are different, both outputs can be ignored and a new address is used for both.

Figure 8E:
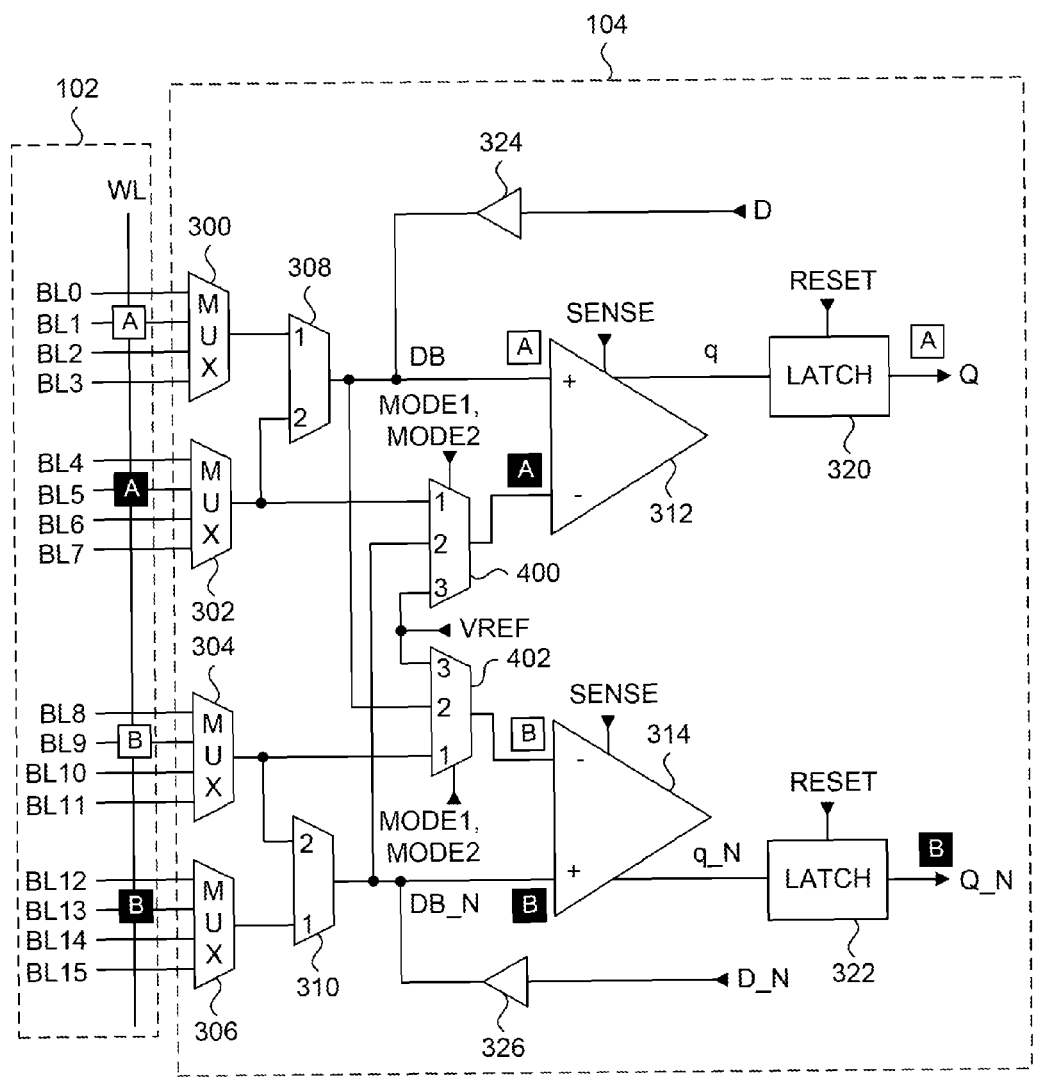

While the previous embodiment of FIG. 8D provides single ended outputs which can exhibit a power signature, the same circuit can be used to provide redundant differential sensing with differential outputs to minimize power signature, as shown by example in the embodiment of FIG. 8E.

In the redundant differential sensing with differential outputs operation of FIG. 8E, one bit of information is stored as complementary data states in cells connected to BL1 and BL5, while another different bit of information is stored as complementary data states in cells connected to BL9 and BL13. It should be noted that the data storage configuration of the "B" boxes is swapped relative to the configuration shown in the embodiment of FIG. 8D. As in the embodiment of FIG. 8D, the data states of the two white boxes are the same while the data states of the two black boxes are the same.

With this data storage configuration of FIG. 8E, redundancy can be provided for mission critical applications. In the read mode, the white "A" data is compared to the black "A" data at sense amplifier 312 and white "B" data is compared to the black "B" data at sense amplifier 314. To do this, the second stage bitline selectors 308 and 310 are controlled to couple BL1 and BL13 to DB and DB_N respectively, and reference selectors 400 and 402 can be controlled by MODE1 and MODE2 to couple BL5 to sense amplifier 312 and BL9 to sense amplifier 314. In this read mode, Q and Q_N should be complementary data states if the complementary data was properly programmed to the memory cells connected to bitlines BL1 and BL13. This can be referred to as a simple secure-redundant differential mode of operation.

Figure 8F:
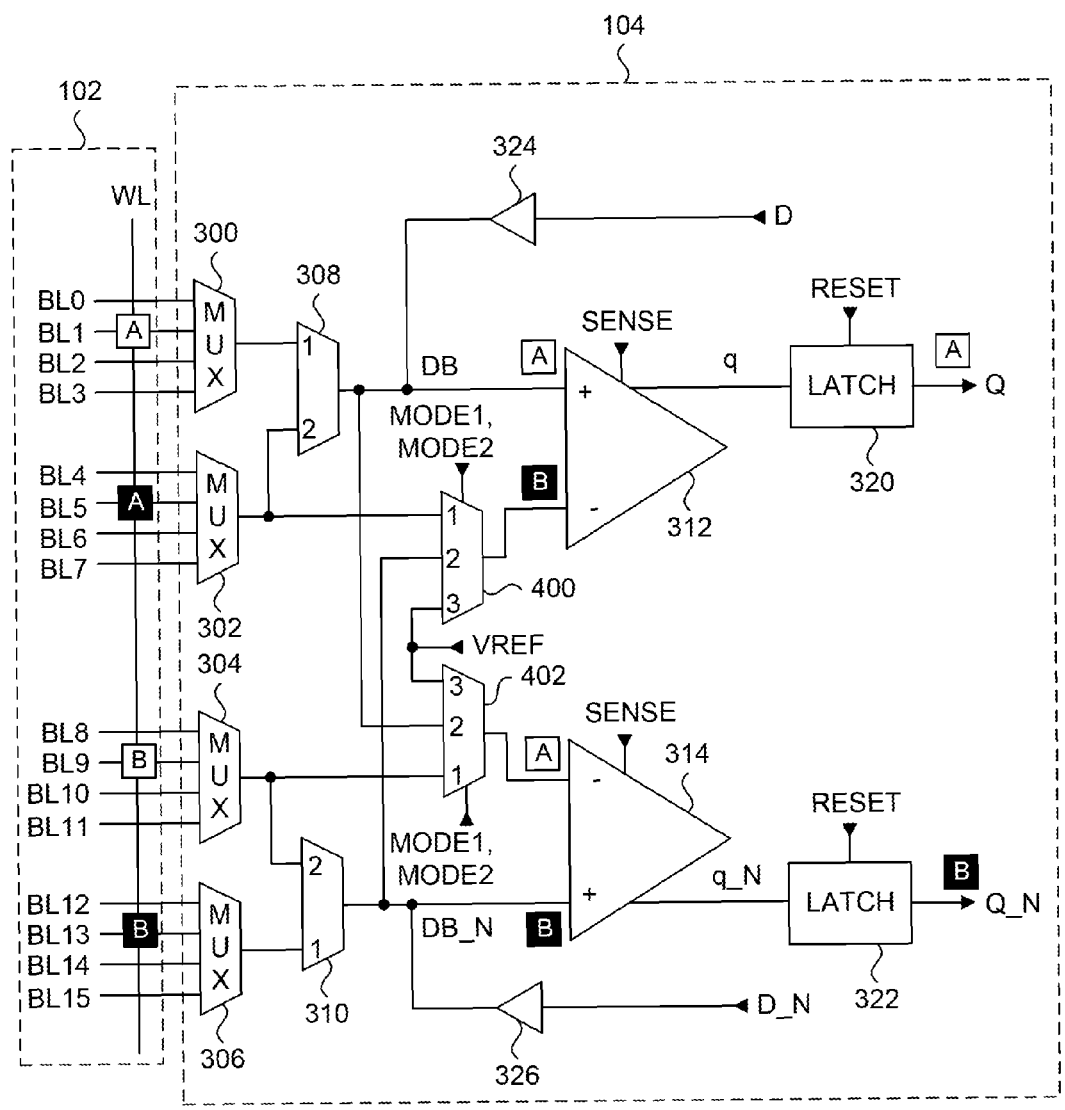

Another alternate mode of operation for the circuit embodiment of FIG. 8E having the same data storage pattern is shown in FIG. 8F. With this data storage configuration, redundancy can be provided for mission critical applications. In a first read mode, the white "A" data is compared to the black "B" data at sense amplifiers 312 and 314. To do this, the second stage bitline selectors 308 and 310 are controlled to couple BL1 and BL13 to DB and DB_N respectively, and reference selectors 400 and 402 can be controlled by MODE1 and MODE2 to couple DB to sense amplifier 314 and DB_N to sense amplifier 312. In this read mode, Q and Q_N should be complementary data states if the complementary data was properly programmed to the memory cells connected to bitlines BL1 and BL13.

In a second read mode, the black "A" data is compared to the white "B" data at sense amplifiers 312 and 314. To do this, the second stage bitline selectors 308 and 310 are controlled to couple BL5 and BL9 to DB and DB_N respectively, and reference selectors 400 and 402 can be controlled by MODE1 and MODE2 to couple DB to sense amplifier 314 and DB_N to sense amplifier 312. With reference to FIG. 8E, the black "A" data would appear on the "+" input of sense amplifier 312 and at the "-" input of sense amplifier 314, while the white "B" data would appear on the "-" input of sense amplifier 312 and the"+" input of sense amplifier 314. In this routing configuration of the bitline data to sense amplifiers 312 and 314, the Q and Q_N outputs should still be complementary data states if the complementary data was properly programmed to the memory cells connected to bitlines BL5 and BL9. It should be noted that the Q and Q_N outputs will have data states that are inverted relative to the first read mode, therefore downstream circuits can be used to re-invert the data states.

Figure 9:
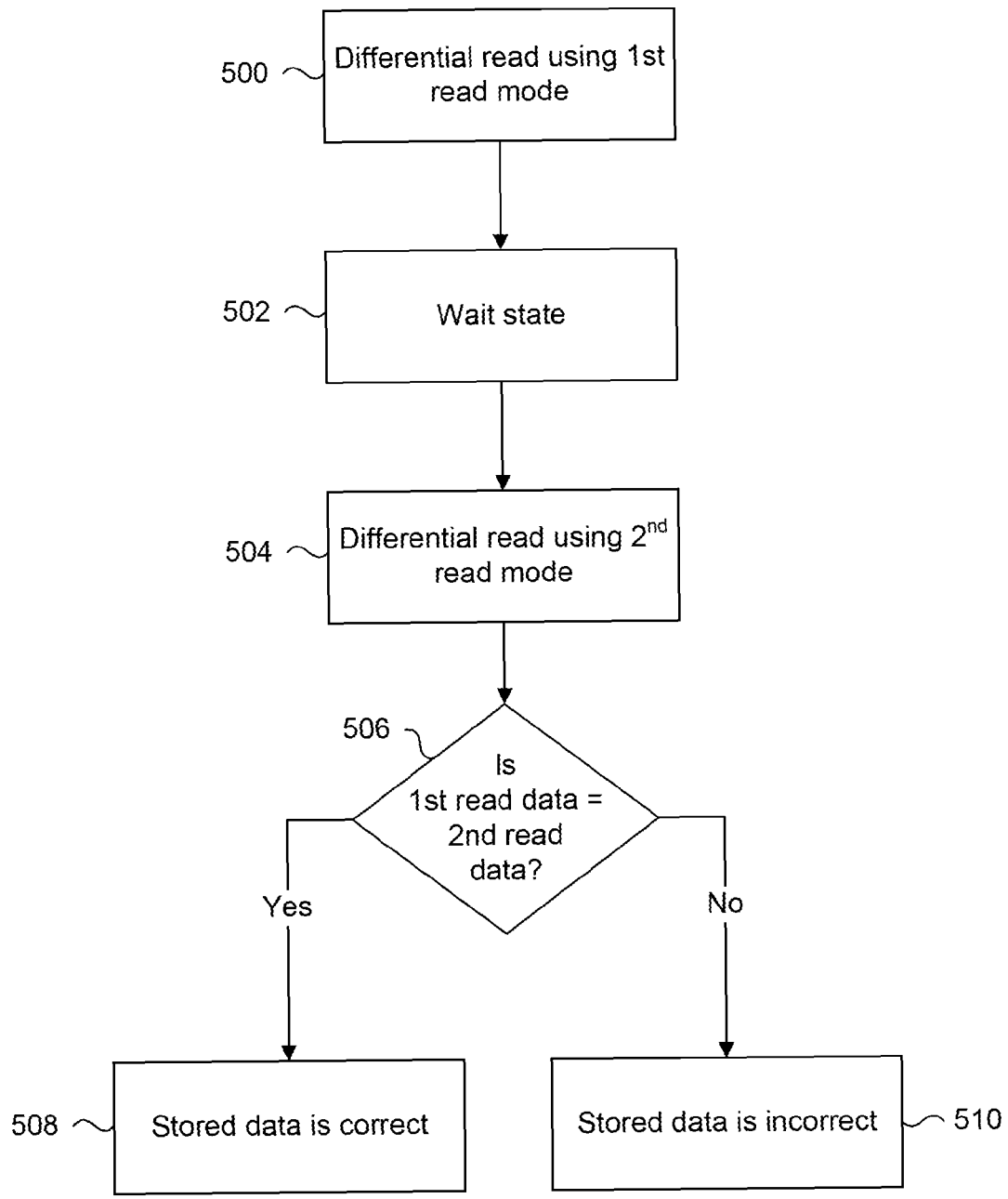
FIG. 9 is a flow chart of a method of operating the embodiments shown in FIGS. 8E and 8F.

Therefore, the embodiment of FIG. 8F can be operated in either of the two different described modes in order to provide redundant and secure differential output data as no power signature is produced. In both read modes, the same stored data is sensed by two different sense amplifiers, but each read mode senses a different pairing of stored data. In a further variation of the embodiment of FIG. 8F, the circuit can be operated using the two previously described modes to provide time-based redundancy, as is now described with reference to the flow chart of FIG. 9. It is assumed that the redundant data has been programmed as shown in FIGS. 8E and 8F. Starting at 500, the first read mode as shown in the embodiment of FIG. 8E is executed to provide the data on the differential outputs Q and Q_N. This first read data can be temporarily stored in first registers (not shown) which are coupled to the Q and Q_N outputs. Following at 502 the method enters a wait state, and then the second read mode as shown in the embodiment of FIG. 8F is executed to provide the data on the same differential outputs Q and Q_N. This second read data can be temporarily stored in second registers (not shown) which are coupled to the Q and Q_N outputs.

Proceeding to 506 the differential data stored in the first registers and second registers can be compared to each other using well-known logic to determine if they match or mismatch. It should be noted that the complementary data carried by Q and Q_N in the first read operation versus the second read operation are inverted relative to each other, therefore the comparison logic should be configured to take this into account. If the data matches, then the method ends at 508 and all 4 stored "A" and "B" bits of data are deemed to be correct. Otherwise, the method proceeds to 510 where at least one of the 4 stored bits is deemed to be incorrectly stored, which may be indicative of defective memory cell. At this point, additional preset algorithms can be executed to identify which of the pairs of stored complementary data bits should not be used.

Accordingly, these two described read modes can be used to validate the programming of the complementary "A" and complementary "B" data by checking that the Q and Q_N outputs are complementary in the first read mode, and complementary but inverted in the second read mode relative to the first read mode. In both read modes, power signature is minimized by inserting the RESET signal in the manner described for the previous embodiments. The previously described method of FIG. 9 can be executed any number of times during the life of the memory system to check the stored data.

The previously described embodiments of the output path circuitry 104 shown in FIGS. 5, 7 and 8A-8E can be configured for one operating mode for the entire memory array. For example, all the mixed sensing blocks can be configured for operating in the differential sensing mode with differential output and any power signature from the memory device is minimized by asserting the RESET signal as previously described. Alternately, some mixed sensing blocks can be configured for one mode of operation while other mixed sensing blocks can be configured for a different mode of operation. For the embodiments of 8 FIGS. 8A-8E, four different modes of operation can be reserved for different parts of the memory array. A different part of a memory array can refer to one or more rows of memory cells connected to particular wordlines, or a range of wordlines. Therefore the previously described MODE signals can be decoded with one or more row addresses for automatic assertion to the appropriate logic level(s) that sets the desired mode of operation. Such flexibility allows the memory array to store a large amount of data, while allowing for storage of a small amount of secure data, such as a code, encryption key, or any other data for which detection by power signature is undesired.

Figure 10:
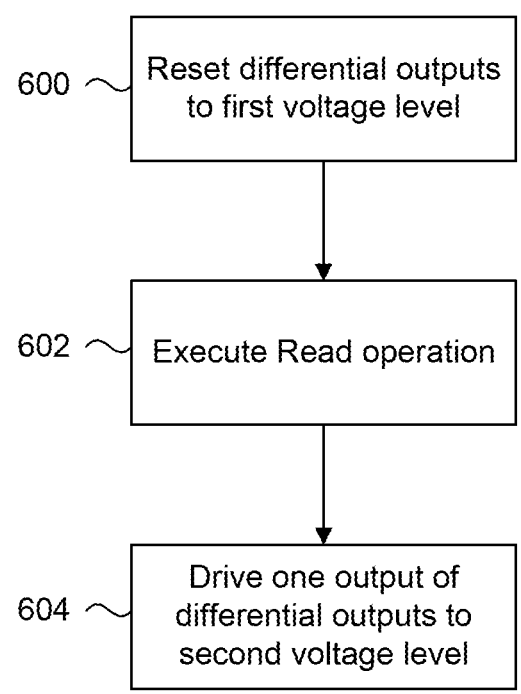
FIG. 10 is a flow chart outlining a method of output path circuitry power signature suppression, according to a present embodiment.

To summarize, several of the presently described embodiments provide power signature suppression when data is stored as two cells (or more) per bit and the output path circuitry provides sensed complementary data on output ports. The flow chart of FIG. 10 summarizes a method for power signature suppression in a semiconductor memory device. The method assumes that data is stored differentially in a memory array, in at least two cells per bit. The method of FIG. 10 starts at 600 by resetting differential or complementary output ports, such as Q and Q_N shown in the previously described embodiments, to a first voltage level. This can be a VSS voltage level or another voltage level corresponding to another possible data state. A read operation is then executed at 602 which starts with activating a wordline (WL) to access memory cells in the memory array. Bitline and/or databus sensing is executed and only one of the output ports is driven to a second voltage level representative of a logic state opposite to the first logic state at 604. This method can be used in any of the previously described embodiments where complementary data is provided after sensing. This technique can further be applied to any other downstream sensing of the Q and Q_N outputs that repeat the data to other circuits.

In the previously described embodiments, resettable output latch circuits 320 and 322 are used to drive the output it is connected to the VSS or VDD supply voltage. In a first alternative embodiment shown in FIG. 11A, a non-resettable latch 700 can replace the previously shown output latch circuits 320 and 322. In such embodiments, the power signature can be suppressed by including a simple n-channel transistor 702 for coupling the input of the latch 700 to ground in response to an active level of the reset signal. While not shown, n-channel transistor 702 can be replaced by a p-channel transistor (not shown) for coupling the input of the latch 700 to VDD in response to an active level of the reset signal.

Figure 11A:
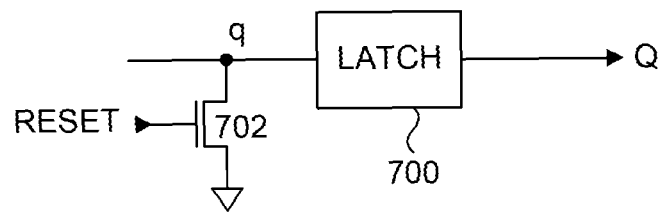
FIGS. 11A and 11B are circuits schematics showing alternate output path circuitry.
Figure 11B:
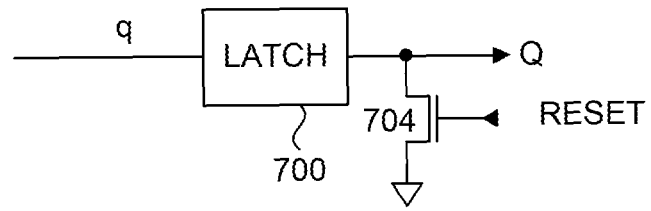

In a second alternative embodiment shown in FIG. 11B, the n-channel transistor 704 is positioned to couple the output of latch 700 to ground in response to an active level of the reset signal. This transistor can be replaced by a p-channel transistor (not shown) that couples the output of latch 700 to VDD in response to an active level of the reset signal. While single transistor devices are shown in the embodiments of FIGS. 11A and 11B by example only, multiple transistor devices in different configurations receiving different control signals can be used to achieve the same result.

For the previously described output path circuitry embodiments, the RESET signal is not used and remains in an inactive state when the circuit is operated in the single ended mode. In an alternate single ended mode of operation of the previous embodiments, the reset signal can be used in a specific manner and sequence. In this alternate single ended mode of operation, the RESET signal can be asserted before each read operation and all outputs are reset alternately to a high logic state and a low logic state for each read operation. For example, the RESET signal is asserted before a first read operation to reset all outputs to a low logic state, followed by a first data read operation. On the next clock cycle, the RESET signal is asserted to reset all outputs to a high logic state, followed by a second data read operation.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A semiconductor device, comprising:
   a memory array having memory cells connected to bitlines and wordlines for providing a bit of data in a read operation from at least one bitline; and
   output path circuitry coupled to the bitlines and configured to sense the bit of data from the at least one bitline, the output path circuitry having first and second output ports configured to be selectively driven to a reset voltage level in a read operation in response to a control signal before the at least one bitline is sensed, and configured to output the sensed bit of data by driving one of the first and second output ports to a voltage level corresponding to the sensed bit of data.

2. The semiconductor device of claim 1, wherein the reset voltage is one of first voltage supply level (VDD) and a second voltage supply level (VSS).

3. The semiconductor device of claim 1, wherein the memory array is configurable to store the bit of data in a single memory cell corresponding to one logic state, or in at least two memory cells corresponding to complementary logic states.

4. The semiconductor device of claim 3, wherein the memory array is configurable to store the bit of data in a first pair of memory cells corresponding to the complementary logic states, and a second pair of memory cells corresponding to the complementary logic states.

5. The semiconductor device of claim 3, wherein the memory array is configurable to store the bit of data in a first pair of memory cells corresponding to the complementary logic states, and a second pair of memory cells corresponding to the inverted complementary logic states.

6. The semiconductor device of claim 3, wherein a first portion of the memory array is configured to store data in single memory cells and a second portion of the memory array is configured to store data in at least two memory cells.

7. The semiconductor device of claim 3, wherein the memory array is configured to store the bit of data in a single memory cell, the control signal is inhibited to prevent the first and the second output ports from being driven to a reset voltage level, and the output path circuity outputs the sensed bit of data on the first output port and senses another bit of data from another bitline for output on the second output port.

8. The semiconductor device of claim 3, wherein the memory array is configured to store the bit of data in at least two memory cells, and the output path circuitry includes reset circuits each configured to drive the first output port and the second output port to the reset voltage level in response to the control signal.

9. The semiconductor device of claim 8, wherein the reset circuits include a first transistor device connected between the first output port and the reset voltage, and a second transistor device connected between the second output port and the reset voltage, each of the first and second transistor devices having gate terminals for receiving the control signal.

10. The semiconductor device of claim 8, wherein the reset circuits include a first latch connected to the first output port, and a second latch connected to the second output port, each of the first and second latches being resettable by the control signal to drive the first output port and the second output port to the reset voltage.

11. The semiconductor device of claim 2, wherein the output path circuitry includes
bitline selectors for coupling a first bitline to a first databus and a second bitline to a second databus; and
a sensing block selectively operable in a single ended sensing mode and a differential sensing mode for sensing voltages on the first databus and the second databus, and configured to drive the first and second output ports to either the first voltage supply level (VDD) or the second voltage supply level (VSS).

12. The semiconductor device of claim 11, wherein the sensing block includes output latch circuits each configured to drive the first output port and the second output port to the reset voltage level in response to the control signal.

13. The semiconductor device of claim 12, wherein the sensing block includes
a first single ended sense amplifier operable in the single ended sensing mode and configured to compare the first databus voltage to a reference voltage to provide a first single ended output;
a second single ended sense amplifier operable in the single ended sensing mode and configured to compare the second databus voltage to the reference voltage to provide a second single ended output;
a differential sense amplifier operable in the differential sensing mode and configured to compare the first databus voltage to the second databus voltage to provide differential outputs; and
output selectors configured to couple the first single ended output and the second single ended output to the output latch circuits in the single ended sensing mode, and configured to couple the differential outputs to the output latch circuits in the differential sensing mode.

14. The semiconductor device of claim 12, wherein the sensing block includes
a first differential sense amplifier having a first input connected to the first databus, a second input connected to a first reference node, and a first output;
a second differential sense amplifier having a first input connected to the second databus, a second input connected to a second reference node, and a second output, the first output and the second output being connected to the output latch circuits; and
reference selectors for coupling a reference voltage to the first reference node and the second reference node in the single ended sensing mode, and for coupling the second databus to the first reference node and the first databus to the second reference node in the differential sensing mode.

15. The semiconductor device of claim 14, wherein the reference selectors are further configured to couple a third bitline to the first reference node and to couple a fourth bitline to the second reference node in a second differential sensing mode.

16. The semiconductor device of claim 15, wherein the first bitline and the third bitline carry voltages corresponding to first complementary data, and the second bitline and the fourth bitline carry voltages corresponding to second complementary data.

17. The semiconductor device of claim 15, wherein the first complementary data and the second complementary data represent the same bit of data, and the first differential sense amplifier senses the first complementary data to output a true state of the bit of data and the second differential sense amplifier senses the second complementary data to output a complement of the true state.

18. The semiconductor device of claim 2, wherein the output path circuitry includes bitline selectors configured to selectively couple one of a first bitline and a second bitline to a first databus, and to selectively couple one of a third bitline and a fourth bitline to a second databus;
a first differential sense amplifier having a first input connected to the first databus, a second input connected to a first reference node, and a first output;
a second differential sense amplifier having a first input connected to the second databus, a second input connected to a second reference node, and a second output,
a first output latch circuit and a second output latch circuit each configured to drive the first output port and the second output port to the reset voltage level in response to the control signal; and
reference selectors configured to selectively couple one of a reference voltage, the second bitline and the second databus to the first reference node, and to selectively couple one of the reference voltage, the third bitline and the first databus to the second reference node.

19. A method for reading data from a semiconductor device, comprising:
executing a read operation from a memory array of the memory device by asserting a wordline of the memory array;
resetting differential outputs to a first voltage level; and,
driving one of the differential outputs to a second voltage level in response to the data read from the memory array.

20. The method of claim 19, wherein resetting includes driving differential outputs to the first voltage level.

21. The method of claim 19, wherein resetting includes resetting latch circuits connected to the differential outputs.

22. The method of claim 19, wherein executing the read operation includes activating at least one sense amplifier after asserting the wordline.

23. The method of claim 22, wherein resetting the differential outputs occurs before activating the at least one sense amplifier.

24. The method of claim 22, wherein resetting the differential outputs occurs concurrent to asserting the wordline.

* * * * *